United States Patent
Kuisma et al.

(10) Patent No.: US 9,663,352 B2
(45) Date of Patent: May 30, 2017

(54) MICROELECTROMECHANICAL DEVICE AND A METHOD OF MANUFACTURING

(71) Applicant: MURATA MANUFACTURING CO., LTD., Nagaokakyo-shi, Kyoto (JP)

(72) Inventors: Heikki Kuisma, Helsinki (FI); Sami Nurmi, Tuusula (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days.

(21) Appl. No.: 14/270,861

(22) Filed: May 6, 2014

(65) Prior Publication Data
US 2014/0332910 A1 Nov. 13, 2014

(30) Foreign Application Priority Data
May 10, 2013 (FI) ..................................... 20135488

(51) Int. Cl.
*B81B 7/00* (2006.01)
*H01L 23/00* (2006.01)

(52) U.S. Cl.
CPC ............ *B81B 7/007* (2013.01); *B81B 7/0048* (2013.01); *H01L 24/19* (2013.01); *B81B 2207/098* (2013.01); *H01L 2224/12105* (2013.01); *H01L 2224/16225* (2013.01); *H01L 2224/24137* (2013.01); *H01L 2924/14* (2013.01);
(Continued)

(58) Field of Classification Search
CPC ......... H01L 23/49816; H01L 23/49838; H01L 25/16
See application file for complete search history.

(56) References Cited

U.S. PATENT DOCUMENTS

| | | |
|---|---|---|
| 5,830,372 A | 11/1998 | Hierold |
| 2004/0099909 A1 | 5/2004 | Park et al. |

(Continued)

FOREIGN PATENT DOCUMENTS

| | | |
|---|---|---|
| CN | 1437232 A | 8/2003 |
| CN | 102844859 A | 12/2012 |

(Continued)

OTHER PUBLICATIONS http://www.thesaurus.com/browse/circumferential; 2015.*

(Continued)

*Primary Examiner* — Yu Chen
*Assistant Examiner* — Nilufa Rahim
(74) *Attorney, Agent, or Firm* — Squire Patton Boggs (US) LLP

(57) ABSTRACT

A microelectromechanical device that comprises a wafer plate, a group of one or more wafer connector elements, and an electrical distribution layer between them. For reduced device thickness, the wafer plate comprises at least two dies and bonding material that bonds the at least two dies alongside each other to the longitudinal extent of the wafer plate, wherein at least one of the dies is a microelectromechanical die. The electrical distribution layer covers the wafer plate and includes a layer of dielectric material and a layer of conductive material, wherein the layer of conductive material is patterned within the layer of dielectric material for electrical interconnection of the dies and the wafer connector elements. With the new configuration, significantly reduced MEMS device thicknesses are achieved.

8 Claims, 4 Drawing Sheets

(52) U.S. Cl.
CPC ............... *H01L 2924/1461* (2013.01); *H01L 2924/18162* (2013.01)

(56) References Cited

U.S. PATENT DOCUMENTS

| | | | |
|---|---|---|---|
| 2005/0087356 A1 | | 4/2005 | Forcier |
| 2009/0133251 A1* | | 5/2009 | Tuominen ............... F02M 53/02 29/829 |
| 2010/0072626 A1* | | 3/2010 | Theuss et al. ................. 257/774 |
| 2010/0207257 A1 | | 8/2010 | Lee |
| 2011/0088936 A1 | | 4/2011 | Schaaf et al. |
| 2012/0270354 A1* | | 10/2012 | Hooper et al. ................... 438/51 |
| 2013/0078753 A1* | | 3/2013 | Hayes et al. ..................... 438/51 |

FOREIGN PATENT DOCUMENTS

| | | |
|---|---|---|
| FR | 2 907 633 A1 | 4/2008 |
| JP | 2009-530801 A | 8/2009 |
| JP | 2011-177846 A | 9/2011 |

OTHER PUBLICATIONS

Finnish Search Report dated Mar. 4, 2014 corresponding to Finnish Patent Application No. 20135488.
Gennissen, et al., "Thick polysilicon microstructures by combination of eptitaxial and poly growth in a single deposition step", Proceedings of the 1996 National Sensor Conference, Delft, The Netherlands, Mar. 20-21, 1996, XP000697535, pp. 189-192.
International Search Report dated Apr. 29, 2015, for corresponding International Patent Appln. No. PCT/IB2014/061283.
Finnish Patent and Registration Office, Finnish Search Report for corresponding 20135488, dated Sep. 23, 2015.
Patent Office of the People's Republic of China, Search Report for corresponding Patent Application No. 2014800265392, Jun. 2, 2016.
Korean Patent Office, Office Action corresponding to Appln. No. 10-2015-7032097, Oct. 20, 2016.
Japan Patent Office, Office Action corresponding to Japanese Patent Appln. No. 512464/2016, Jan. 4, 2017.

* cited by examiner

MICROELECTROMECHANICAL DEVICE AND A METHOD OF MANUFACTURING

FIELD OF THE INVENTION

The present invention relates to microelectromechanical devices and to a method of manufacturing a microelectromechanical device.

BACKGROUND OF THE INVENTION

Micro-Electro-Mechanical Systems, or MEMS devices can be defined as micro-scale mechanical and electromechanical systems where at least some elements have some sort of mechanical functionality. Since MEMS devices can be created with the same tools used to create integrated circuits, micromachines and microelectronic elements can be fabricated on a piece of silicon to enable various types of devices.

The dimensions of microelectromechanical devices are very small, the components typically range in size from tens of micrometers to some millimeters. This means that mechanical deformations, displacements or deflections detected in the microelectromechanical devices are also small, and thereby vulnerable to external disturbances. This imposes many challenges to the design. With microelectromechanical devices, a die that comprises a microelectromechanical element and at least one more die that comprises electronics associated to the microelectromechanical element are typically encapsulated into a package.

However, the height of the package is becoming a bottleneck for microelectromechanical devices, which are typically stacked with an integrated circuit die on a carrier and then over-molded. In this traditional way the height has in best examples been in the order of 0.8 mm. However, decreasing it further does not seem to be possible due to problems in handling of very thin dies, wire bonding loop height, thickness of the adhesive layers and thickness of the carrier.

BRIEF DESCRIPTION OF THE INVENTION

The object of the present invention is to provide a package structure that enables application of microelectromechanical devices in smaller packages. The objects of the present invention are achieved with a microelectromechanical device and a method of manufacturing a microelectromechanical device according to the characterizing portions of the independent claim.

The preferred embodiments of the invention are disclosed in the dependent claims.

The claimed invention defines a microelectromechanical device that comprises a wafer plate, a group of one or more wafer connector elements, and an electrical distribution layer between them. The wafer plate comprises at least two dies and bonding material that bonds circumferentially the at least two dies alongside each other to the longitudinal extent of the wafer plate, wherein at least one of the dies is a microelectromechanical die. The electrical distribution layer covers the wafer plate and includes at least one layer of dielectric material and at least one layer of conductive material, wherein the layer of conductive material is patterned within the layer of dielectric material for electrical interconnection of the dies and the wafer connector elements. The electrical distribution layer has a first part that covers the at least one microelectromechanical die and regions of bonding material between the microelectromechanical die and adjacent edges of the wafer plate. The group of one or more wafer connector elements are positioned only on the electrical distribution layer in positions outside the first part.

With the new configuration of dies in a mufti-die device, significantly reduced MEMS device thicknesses are achieved.

Features and advantages of the claimed invention and its embodiments are described in more detail with the detailed description of the embodiments.

BRIEF DESCRIPTION OF THE FIGURES

In the following the invention will be described in greater detail, in connection with preferred embodiments, with reference to the attached drawings, in which.

DETAILED DESCRIPTION OF SOME EMBODIMENTS

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of microelectromechanical devices comprise elements that are generally known to a person skilled in the art and may not be specifically described herein.

Figure 1:
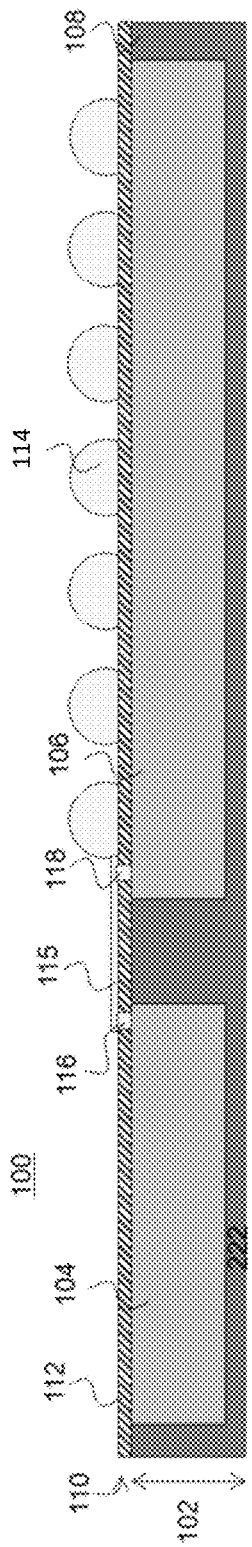
FIG. 1 illustrates a side view of an embodiment of a microelectromechanical (MEMS) device.

FIG. 1 illustrates a side view of an embodiment of a microelectromechanical (MEMS) device 100 according to the present invention. A MEMS device of FIG. 1 comprises a wafer plate 102, planar object whose length along the plate is greater than the thickness of the plate. The wafer plate 102 comprises at least one MEMS die 104 that comprises a mechanically deforming element and an electrical transducer that in response to deformations of the deforming element creates an electrical output signal for further processing in the MEMS device. Die structures may be produced in large batches on a single wafer through various processes, and the wafer may be diced into many pieces, each containing a copy of the structure. A piece of semiconducting material with a defined structure, diced off the wafer is called herein a die. The MEMS die 104 may comprise electrical input and output terminals 116 through which electrical signals are input from and output to the MEMS die.

The wafer plate 102 comprises at least one other die, which may be an integrated circuit (IC) die 106 that includes measurement circuitry for the signal output from the MEMS die 104. Also the IC die 106 may comprise electrical input and output terminals 118 through which electrical signals are input from and output to the IC die. The dies 104, 106 are bonded alongside each other to the longitudinal extent of the wafer plate with bonding material 108. The dies 104, 106 and the bonding material 108 thus form a planar layer of the wafer plate 102.

On top of the wafer plate 102 is formed an electrical distribution layer 110. The electrical distribution layer 110 includes a layer of dielectric material 112 and a layer of conductive material 115, wherein the layer of conductive material is patterned into the layer of dielectric material to selectively interconnect electrical input terminals 116, 118 of the MEMS die 104 and the IC die 106. The dielectric layer 112 may be of a polymer dielectric material, and the conductive layer may be a deposited film of metal, for example, copper. It is noted that the electrical distribution layer structure of FIG. 1 is exemplary only. Other selectively layer configurations formed of dielectric and conductive materials may be applied within the scope.

Let us assume that the surface of the wafer plate 102 in the side of the electrical distribution layer 110 is the top surface, and the surface of the wafer plate 102 in the other side is the bottom surface. The MEMS die 104 and the IC die 106 are positioned to extend along the top surface of the wafer plate 102 abreast of each other such that their longest dimensions extend parallelly in the direction of the top surface. Due to this, their shortest dimensions extend to the thickness of the wafer plate 102. The wafer plate profile is thus very thin, which enables provision of thinner MEMS devices than before.

As shown in FIG. 1, the MEMS device comprises also a group of one or more wafer connection elements 114 that connect through the conductive material paths of the electrical distribution layer 110 to the dies 104, 106 within the wafer plate 102. The wafer connection elements may be, for example, solder bumps, metal coated polymer core spheres, copper pillars, land pads, or any other elements used for connecting an electrical device to a printed wiring board, all of which are well known to a person skilled in the art.

Wafer level packaging (WLP) of integrated circuits has rapidly become a major technology for packaging relatively small and low IO-count circuits. The technology comprises deposition of polymer insulation layers, copper conductor tracks and solder balls directly on the silicon circuit so that any other traditional packaging steps, like die attach, wire bonding and plastic over-molding are no longer needed and the device can, after dicing of the wafer, be directly soldered to a printed wiring board in a standard reflow soldering process.

The concept of WLP has been extended to higher IO-count circuits by so called fan-out wafer level packaging (FO-WLP) where known good (tested) dies are embedded in plastic molding material as a two-dimensional array to constitute a reconstructed wafer. The dies are bound by the plastic material and are located in a regular array with wider die-spacing than on the original wafer. On this re-built wafer similar deposition of dielectric films, copper films and solder bumps can be done as in standard WLP-technology.

It is also known that mufti-die devices can be built based on FO-WLP by having a group of dies with surrounding and binding plastic material to form a new mufti-die device. Stacking of dies on the WLP-wafer or FO-WLP wafer has been previously proposed to increase the complexity of the mufti-die device. In the present invention, the new configuration of dies in a mufti-die device is applied to achieve significantly reduced MEMS device thicknesses. MEMS device thicknesses of the order of 0.4 mm have been achieved now.

It is noted that the process steps of wafer level packaging, as such, are widely documented and as such known to a person skilled in the art of MEMS manufacturing. The Figures and the associated description of the claimed layered structure serve simultaneously as a description for corresponding manufacturing method claims.

Figure 2:
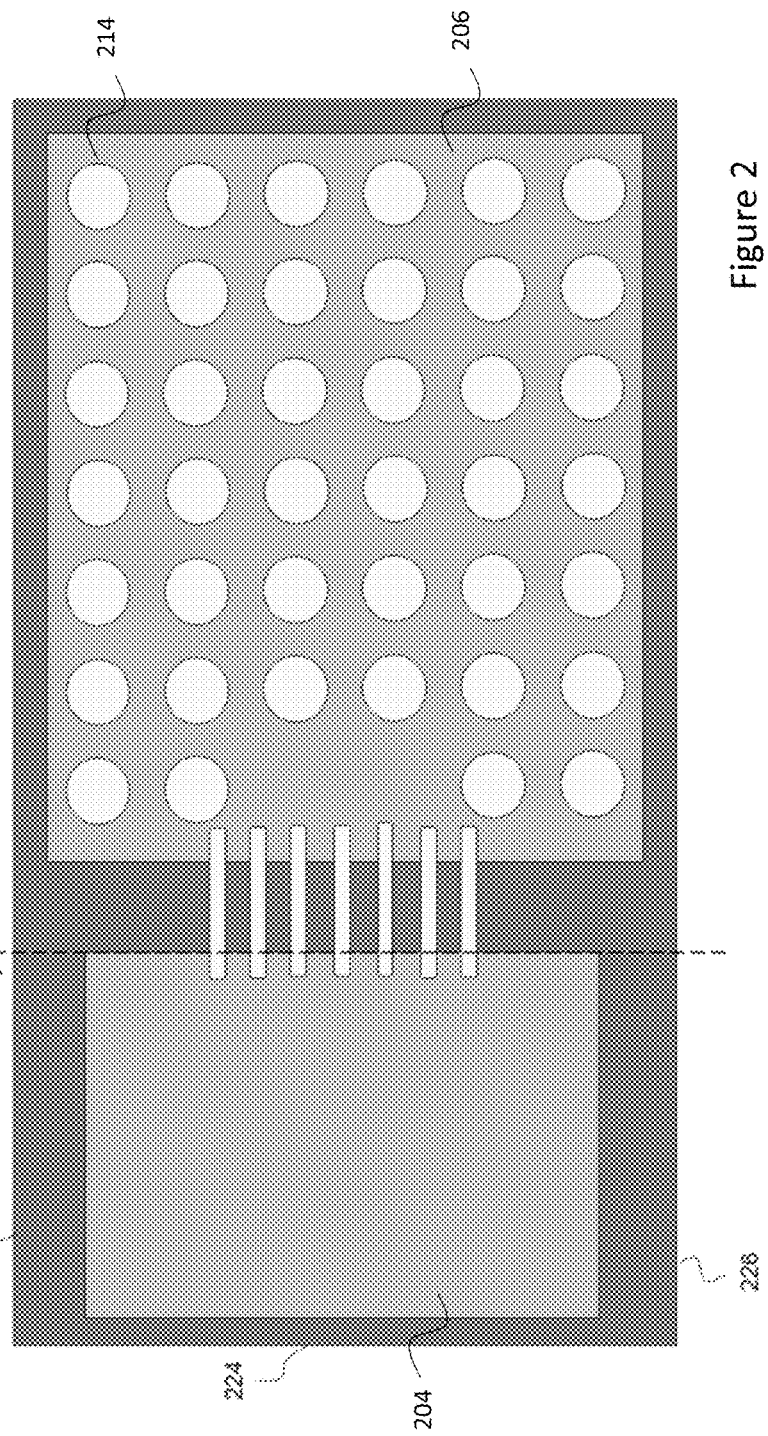
FIG. 2 shows a top view to the MEMS device illustrated in FIG. 1.

FIG. 2 shows a top view to the MEMS device illustrated in FIG. 1. In microelectromechanical devices, the dimensions are very small, the components typically range in size from tens of micrometers to some millimeters. This imposes many challenges to the design. For example, in a microelectromechanical pressure sensor, the detected diaphragm displacements due to pressure change can be nanometers of less. This means that signals generated by the displacements are very small, and measurements are quite vulnerable to external disturbances. Such disturbances may occur, for example, when the microelectromechanical element is connected with the wafer connector elements to a printed wiring board. The board may have a structure that slightly bends due to thermal expansion when temperature changes, or the board may be subjected to external forces that bend it. The effect of this bending to the operation of the MEMS dice may be high, especially when the MEMS device is very slim.

FIG. 2 illustrates a configuration where effect of external bending stresses are minimized by specific positioning of the wafer connector elements. In plane view, only the top surface of the electrical distribution layer and the wafer connector elements would be visible. FIG. 2 illustrates, however, also as blocks the MEMS die 204 and the IC die 206 that are underneath the surface and are covered by the electrical distribution layer. The electrical distribution layer has a first part 220 that covers the MEMS die 204 and regions of bonding material between the MEMS die 204 and adjacent edges 222, 224, 226 of the wafer plate. Adjacent edges 222, 224, 226 refer herein to each edge of the wafer plate that in the top view of FIG. 2 circumscribes the MEMS die such that in a plane through the thickness of the wafer plate, only bonding material exists between the circumference of the MEMS die and the edge. In other words, there is no other die (like the IC die 206) between the adjacent edges 222, 224, 226 of the wafer plate and the MEMS die. In the present embodiment the group of one or more wafer connector elements 214 are positioned on the electrical distribution layer in positions outside the first part 220.

Figure 3:
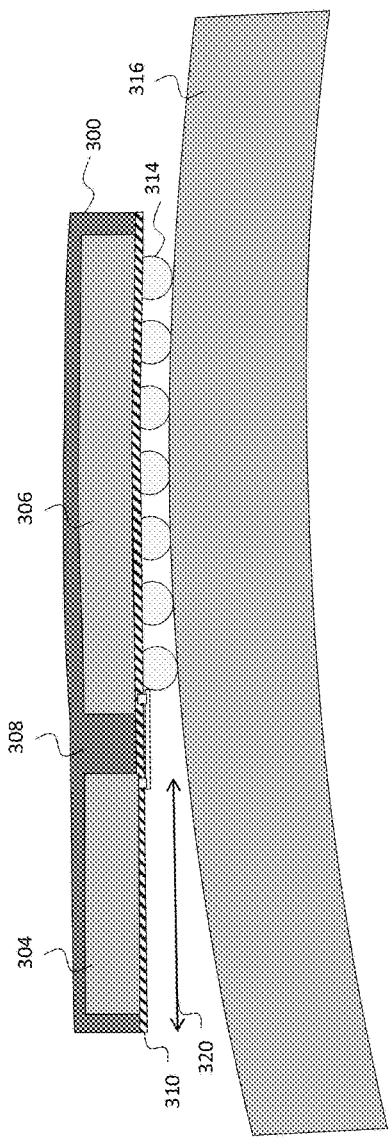
FIG. 3 illustrates the effect of the claimed positioning during bending of underlying support structures.

The effect of the claimed positioning is illustrated in FIG. 3. FIG. 3 shows the MEMS die 304, the IC die 306, bonding material regions 308, the electrical distribution layer 310 and the wafer connector elements 314 described in more detail with FIG. 1. FIG. 3 also illustrates the extent of the first part 320 of the electrical distribution layer 310. When the wafer connector elements 314 that mechanically connect the MEMS device 300 to the underlying board 316 are not positioned on surfaces that cover the MEMS die 304, nor on the opposite sides of the MEMS die 304, the stress experienced by the MEMS element from bending of the underlying support structures is minimized.

Figure 4:
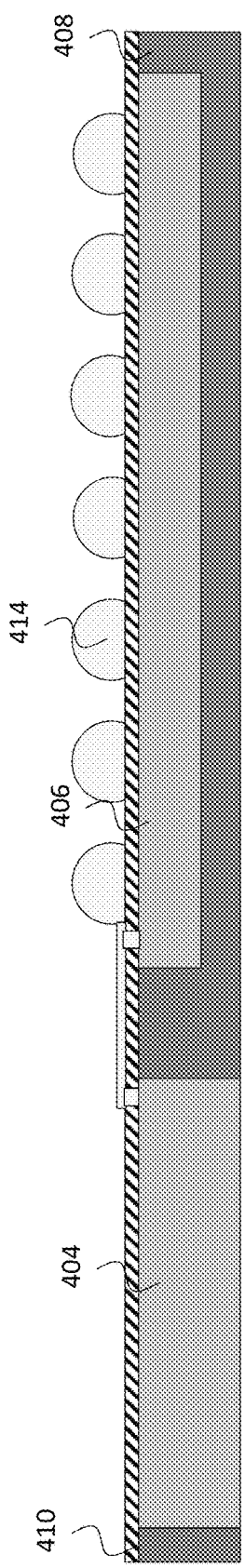
FIG. 4 illustrate a further embodiment for reducing stresses in the MEMS device.
Figure 5:
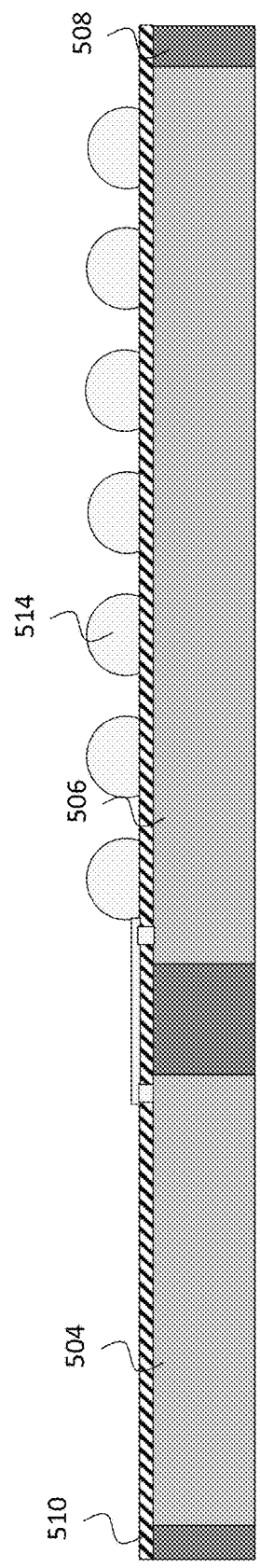
FIG. 5 illustrate an alternative embodiment for reducing stresses in the MEMS device.

Another source of bending related errors in the MEMS device is mismatch of thermal expansion coefficients of the bonding material and the dies. FIGS. 4 and 5 illustrate a further embodiment, where mechanical stresses caused by such thermal expansion mismatch is reduced by removing a layer of the bonding material from the bottom surface, i.e. the surface of the wafer plate that is opposite to the surface covered by the electrical distribution layer. FIGS. 4 and 5 shows the MEMS die 404, 504 the IC die 406, 506 bonding material regions 408, 508 the electrical distribution layer 410, 510 and the wafer connector elements 414, 514 described in more detail with FIG. 1. Advantageously the bonding material 408 is completely removed from areas below the MEMS die 404, 504. FIG. 4 illustrates a configuration where the MEMS die 404 is thicker than the IC die 406, and the bonding material 408 is completely removed from areas below the MEMS die 404. The bonding material surrounds both of the dies, and covers the IC die 406. FIG. 5 illustrates a configuration where the MEMS die 504 and the IC die 506 are equally thick, and the bonding material 508 is completely removed from areas below both of the dies 504, 506. The bonding material 508 surrounds both of the dies.

This claimed configuration may be advantageously applied in a variety of different MEMS devices that are susceptible to mechanical stress, including sensors like accelerometers, angular rate sensors, pressure sensors and microphones. In these embodiments, the microelectromechanical die includes a structure that deforms according to the sensed phenomenon. The claimed configuration may also be used in other MEMS devices that are susceptible to mechanical stress, like MEMS resonators used as timing devices where the microelectromechanical die includes a structure that deforms accurately in a specific applied resonance frequency. The claimed configuration may also be used in RF-MEMS components like switches, variable capacitors and band pass filters.

Figure 6:
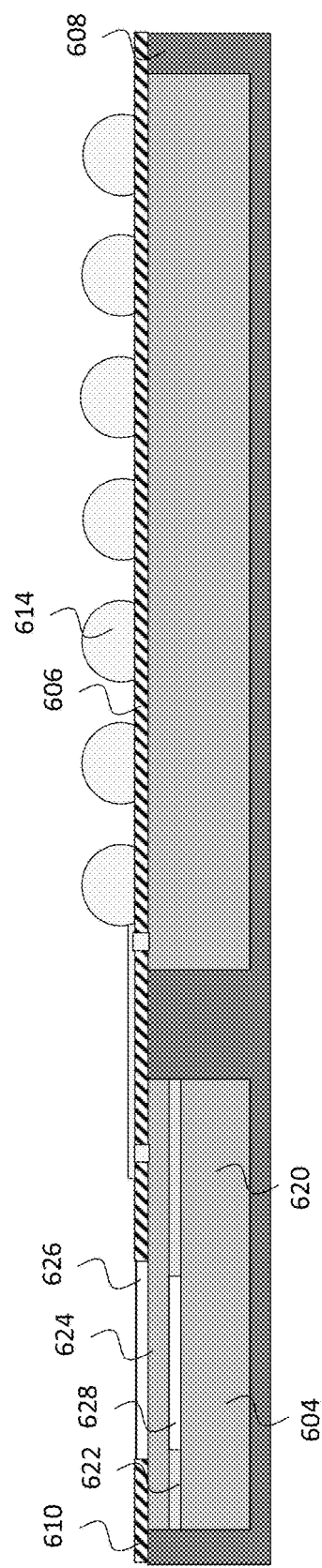
FIG. 6 illustrates an exemplary structure of a microelectromechanical device for sensing of pressure.

It is especially advantageous to apply the claimed configuration in a microelectromechanical pressure sensor that comprises a pressure sensor structure. Pressure is a physical quantity that corresponds to the ratio of force acting on a surface to the area of the surface. Firstly, prior art packaged pressure sensors tend to be large in size compared to typical die dimensions. The greater difficulty in packaging pressure sensors is the need to provide an open surface of a die to interact with the applied pressure, contrary to e.g. an accelerometer that can be completely enclosed by the package material. A device that can be used as a gauge to measure the pressure is a pressure sensor. FIG. 6 illustrates an exemplary structure of a microelectromechanical device for sensing of pressure. FIG. 6 shows the MEMS die 604, the IC die 606, bonding material regions 608, the electrical distribution layer 610 and the wafer connector elements 614 described in more detail with FIG. 1. A microelectromechanical pressure sensor die typically comprises a thin diaphragm that extends over a gap that provides a volume in a reference pressure. The gap may be evacuated to contain only small amounts of residual gases, but it can also be filled with a selected gas or other volatile material at a selected reference pressure. The diaphragm deforms due to difference between the reference pressure and an ambient pressure surrounding the sensor. The diaphragm displacement may be translated to an electrical signal with capacitive or piezoresistive sensing.

The MEMS die 604 of Figures illustrates a pressure sensor that comprises a body structure formed by a planar base 620 and side walls 622. They form a hollow that is hermetically sealed by a diaphragm plate 624 that extends on the side walls. The planar base 620, the side walls 622 and the diaphragm plate 624 are attached to each other to form a hermetically closed gap 628 that provides a volume in a reference pressure. In order to allow deflection of the diaphragm in response to the ambient pressure, an opening 626 in the electrical distribution layer 610 extends over the diaphragm. A further dielectric layer may be deposited over any exposed layers of conductive material of the electrical distribution layer.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A microelectromechanical device that comprises a wafer plate, wafer connector elements configured to connect the microelectromechanical device to a board, and an electrical distribution layer between the wafer plate and the wafer connector elements, wherein
the wafer plate comprises at least two dies and bonding material that mechanically bonds circumferentially the at least two dies alongside each other along a longitudinal extent of the wafer plate such that the at least two dies and the bonding material form a planar layer of the wafer plate, wherein at least one of the dies is a microelectromechanical die;
the electrical distribution layer covers the wafer plate and includes at least one layer of dielectric material and at least one layer of conductive material, wherein the layer of conductive material is patterned within the layer of dielectric material for electrical interconnection of the dies and the wafer connector elements;
the electrical distribution layer has a first part that covers the at least one microelectromechanical die and regions of bonding material between the microelectromechanical die and edges of the wafer plate adjacent to the microelectromechanical die;
all of the wafer connector elements of the microelectromechanical device are positioned on the electrical distribution layer outside the first part.

2. A microelectromechanical device of claim 1, wherein a surface of the microelectromechanical die is exposed in a surface of the wafer plate, wherein the surface of the wafer plate is opposite to the side of the electrical distribution layer.

3. A microelectromechanical device of claim 1, wherein
the microelectromechanical die includes a pressure sensor element with a diaphragm;
the electrical distribution layer includes an opening that extends over the diaphragm of the microelectromechanical die.

4. A microelectromechanical device of claim 1, wherein the microelectromechanical die includes a deforming structure for a stress susceptible sensor of one of the following type: accelerometer, angular rate sensor, pressure sensors and microphones.

5. A microelectromechanical device of claim 1, wherein the microelectromechanical die includes a deforming structure for a microelectromechanical resonator, or a microelectromechanical radio-frequency component.

6. A method of manufacturing a microelectromechanical device that comprises a wafer plate, wafer connector elements for connecting the microelectromechanical device to a board, and an electrical distribution layer between the wafer plate and wafer connector elements, wherein the method includes
including in the wafer plate at least two dies and bonding material that mechanically bonds the at least two dies alongside each other along a longitudinal extent of the wafer plate such that the at least two dies and the bonding material form a planar layer of the wafer plate, wherein at least one of the dies is a microelectromechanical die;

covering the wafer plate with the electrical distribution layer that includes at least one layer of dielectric material and at least one layer of conductive material, wherein the layer of conductive material is patterned within the layer of dielectric material for electrical interconnection of the dies and the wafer connector elements, and the electrical distribution layer has a first part that covers the at least one microelectromechanical die and regions of bonding material between the microelectromechanical die and edges of the wafer plate adjacent to the microelectromechanical die;

positioning all of the wafer connector elements of the microelectromechanical device on the electrical distribution layer outside the first part.

7. A method of claim 6, wherein the method further includes exposing a surface of the microelectromechanical die in a surface of the wafer plate, wherein the surface of the wafer plate is opposite to the side of the electrical distribution layer.

8. A method of claim 6, wherein the method further includes:

including in the microelectromechanical die a pressure sensor element with a diaphragm;

processing to the electrical distribution layer an opening that extends over the diaphragm of the microelectromechanical die.

* * * * *